United States Patent
Shinya et al.

(10) Patent No.: US 9,945,047 B2
(45) Date of Patent: *Apr. 17, 2018

(54) METHOD FOR GROWING SILICON CARBIDE CRYSTAL

(71) Applicant: Shin-Etsu Chemical Co., Ltd., Tokyo (JP)

(72) Inventors: Naofumi Shinya, Fukui (JP); Yu Hamaguchi, Fukui (JP); Norio Yamagata, Fukui (JP); Takehisa Minowa, Fukui (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 324 days.

This patent is subject to a terminal disclaimer.

(21) Appl. No.: 14/559,299

(22) Filed: Dec. 3, 2014

(65) Prior Publication Data

US 2015/0159299 A1 Jun. 11, 2015

(30) Foreign Application Priority Data

Dec. 6, 2013 (JP) .................................. 2013-253411
Dec. 6, 2013 (JP) .................................. 2013-253426

(Continued)

(51) Int. Cl.
C30B 13/02 (2006.01)
C30B 19/02 (2006.01)
(Continued)

(52) U.S. Cl.
CPC .............. *C30B 13/02* (2013.01); *C30B 11/08* (2013.01); *C30B 13/14* (2013.01); *C30B 15/02* (2013.01);
(Continued)

(58) Field of Classification Search
CPC .......... C30B 29/36; C30B 19/04; C30B 19/02; C30B 9/10; C30B 11/04; C30B 15/10; C30B 13/02
See application file for complete search history.

(56) References Cited

U.S. PATENT DOCUMENTS

| | | | |
|---|---|---|---|
| 3,053,635 | A | 9/1962 | Shockley |
| 3,278,274 | A | 10/1966 | Liebmann et al. |

(Continued)

FOREIGN PATENT DOCUMENTS

| | | |
|---|---|---|
| JP | 63-17258 A | 1/1988 |
| JP | 7-172998 A | 7/1995 |

(Continued)

OTHER PUBLICATIONS

"The most recent technology for a SiC power device", Chapter 1.2 Process for SiC Solution Growth, Science & Technology, Co., Ltd., Published May 14, 2010, with English Translation, 8 pages.

(Continued)

*Primary Examiner* — Matthew Song
(74) *Attorney, Agent, or Firm* — Oblon, McClelland, Maier & Neustadt, L.L.P.

(57) ABSTRACT

In the present invention, a crucible formed of SiC as a main component is used as a container for a Si—C solution. The SiC crucible is heated such that, for example, an isothermal line representing a temperature distribution within the crucible draws an inverted convex shape; and Si and C, which are derived from a main component SiC of the crucible, are eluted from a high-temperature surface region of the crucible in contact with the Si—C solution, into the Si—C solution, thereby suppressing precipitation of a SiC polycrystal on a surface of the crucible in contact with the Si—C solution. To the Si—C solution of this state, a SiC seed crystal is moved down from the upper portion of the crucible closer to the Si—C solution and brought into contact with (Continued)

the Si—C solution to grow a SiC single crystal on the SiC seed crystal.

8 Claims, 10 Drawing Sheets

(30) Foreign Application Priority Data

| Dec. 6, 2013 | (JP) | 2013-253490 |
|---|---|---|
| Dec. 6, 2013 | (JP) | 2013-253502 |
| Dec. 6, 2013 | (JP) | 2013-253540 |
| Dec. 6, 2013 | (JP) | 2013-253541 |

(51) Int. Cl.

| C30B 17/00 | (2006.01) |
|---|---|
| C30B 29/36 | (2006.01) |
| C30B 13/14 | (2006.01) |
| C30B 15/02 | (2006.01) |
| C30B 15/20 | (2006.01) |
| C30B 11/08 | (2006.01) |
| C30B 15/10 | (2006.01) |
| C30B 19/04 | (2006.01) |
| C30B 9/10 | (2006.01) |

(52) U.S. Cl.
CPC ............ *C30B 15/206* (2013.01); *C30B 17/00* (2013.01); *C30B 29/36* (2013.01); *C30B 9/10* (2013.01); *C30B 15/10* (2013.01); *C30B 19/04* (2013.01)

(56) References Cited

U.S. PATENT DOCUMENTS

| 4,853,299 A | 8/1989 | Mizutani et al. |
|---|---|---|
| 2009/0084309 A1 | 4/2009 | Sakamoto |
| 2009/0178610 A1 | 7/2009 | Sakamoto et al. |
| 2010/0288188 A1 | 11/2010 | Terashima et al. |
| 2011/0200833 A1* | 8/2011 | Kamei .................. C30B 9/10 428/446 |
| 2012/0211769 A1 | 8/2012 | Kusunoki et al. |
| 2013/0220212 A1 | 8/2013 | Kusunoki et al. |
| 2014/0116325 A1* | 5/2014 | Kamei .................. C30B 29/36 117/13 |
| 2014/0127466 A1 | 5/2014 | Danno |
| 2015/0128847 A1 | 5/2015 | Danno |
| 2015/0159297 A1 | 6/2015 | Shinya et al. |

FOREIGN PATENT DOCUMENTS

| JP | 8-208336 A | 8/1996 | |
|---|---|---|---|
| JP | 2000-264790 | 9/2000 | |
| JP | 2001-106600 A | 4/2001 | |
| JP | 2004-2173 | 1/2004 | |
| JP | 2005-82435 A | 3/2005 | |
| JP | 2006-143555 | 6/2006 | |
| JP | 2007-126335 A | 5/2007 | |
| JP | 2007-197231 A | 8/2007 | |
| JP | 2009-91222 A | 4/2009 | |
| JP | 2011-98853 A | 5/2011 | |
| JP | 2011-98870 A | 5/2011 | |
| JP | 2011-251881 A | 12/2011 | |
| JP | 2012-101960 A | 5/2012 | |
| JP | 2012-111670 A | 6/2012 | |
| JP | 2012-184120 A | 9/2012 | |
| JP | 2013-75771 A | 4/2013 | |
| JP | 2013-112553 A | 6/2013 | |
| JP | 2013-173645 A | 9/2013 | |
| JP | 2015-110500 A | 6/2015 | |
| WO | WO 2009/090536 A1 | 7/2009 | |
| WO | WO 2011/024931 A1 | 3/2011 | |
| WO | WO 2011/145387 A1 | 11/2011 | |
| WO | WO 2012176647 A1 * | 12/2012 | ............ C30B 29/36 |
| WO | 2013/157418 A1 | 10/2013 | |

OTHER PUBLICATIONS

U.S. Appl. No. 14/559,362, filed Dec. 3, 2014, Shinya, et al.
Extended European Search Report dated Mar. 20, 2015 in Patent Application No. 14195245.7.
Extended European Search Report dated Mar. 20, 2015 in Patent Application No. 14195250.7.
Takeshi Yoshikawa, et al. "Solution Growth of Silicon Carbide Using Fe—Si Solvent" Japanese Journal of Applied Physics, vol. 49, No. 5, XP001554777, May 1, 2010, pp. 051302-1-051302-6.
Office Action dated Apr. 26, 2018 in European Patent Application No. 14 195 245.7.
Office Action dated Apr. 19. 2016 in European Patent Application No. 14 195 255.7.
Office Action dated Jul. 5, 2016 in Japanese Patent Application No. 2013-253490.
Office Action dated Jul. 5, 2016 in Japanese Patent Application No. 2013-253502.
Office Action dated Jul. 5, 2016 in Japanese Patent Application No. 2013-253540.
Office Action dated Jul. 5, 2016 in Japanese Patent Application No. 2013-253541.
Office Action dated Jul. 5, 2016 in Japanese Patent Application No. 2013-253411.
Office Action dated Jul. 5, 2016 in Japanese Patent Application No. 2013-253426.
International Search Report dated Sep. 13, 2016 in PCT/JP2016/071672.
International Search Report dated Sep. 13, 2016 in PCT/JP2016/071673.
Non-Final Office Action dated Nov. 18, 2016 issued in related U.S. Appl. No. 14/559,362.
Office Action dated Feb. 2, 2018 issued in corresponding Chinese patent application No. 201410741299.6 citing document AO therein.
Office Action dated Feb. 2, 2018 issued in corresponding Chinese patent application No. 201410737734.8 citing document AO therein.

* cited by examiner

Solution of Si, C, M (A)

(B)

(A)

(B)

(A)

(B)

(A)

(B)

(A)

(B)

(A)

(B)

METHOD FOR GROWING SILICON CARBIDE CRYSTAL

BACKGROUND OF THE INVENTION

Field of the Invention

The present invention relates to a method for growing a silicon carbide crystal, and more specifically, a technique for obtaining a high quality single-crystal silicon carbide having few defects by suppressing not only a compositional change of a Si—C solution in a crucible but also precipitation of a polycrystal on the inner wall of a crucible and generation of a metal carbide, which is formed by binding an added metal element M and carbon C.

Description of the Related Art

Silicon carbide (SiC) is a material for a wide band-gap semiconductor and excellent in thermal conductivity and chemical stability, and has excellent basic physical characteristics as a power device also in view of transistor characteristics such as dielectric breakdown characteristics and a saturated drift rate. For these reasons, SiC is highly expected to be used as a material for a next generation power device and commercialization of a SiC power device has been reported.

Such a SiC substrate, however, has problems: the SiC substrate is expensive compared to a Si substrate. In addition, a high-quality single crystal SiC substrate having few defects is not sufficiently formed.

A main reason why it is difficult to produce a high-quality SiC single crystal substrate having few defects is that SiC does not melt under normal pressure. The melting point of Si, which is widely used as a substrate for a semiconductor device, under normal pressure is 1414° C. From a melt of Si, a high-quality single crystal large in diameter having few defects can be obtained by a CZ method or an FZ method.

In contrast, SiC, if it is heated under normal pressure, sublimates at a temperature of about 2000° C. Thus, crystal growth methods such as the CZ method and FZ method cannot be employed. Accordingly, at present, a SiC single crystal is mainly produced by a sublimation method including an improved Rayleigh method.

However, even if a power device is manufactured by using a SiC single crystal obtained by the sublimation method, characteristics of the power device might not be sufficient. This is because it is not easy to form a SiC single crystal having few defects. The phenomenon of crystal growth by the sublimation method is a precipitation directly from a gaseous phase. Because of this, the rate of crystal growth is low and it is difficult to control the temperature of a reaction space. As a result of recent improvements that research and development institutions have intensively made, the dislocation density of micro-pipes have decreased; however, many lattice defects, which have a significant effect upon electric characteristics of devices, such as threading screw dislocation, edge dislocation, basal plane dislocation, are still highly densely present.

Recently, a solution method for growing a silicon carbide crystal has been drawn attention (see, for example, Japanese Patent Laid-Open Nos. 2000-264790, 2004-002173 and 2006-143555). As described above, SiC itself does not melt under normal pressure. Then, in the solution method for producing a SiC single crystal, a Si melt is placed in a graphite crucible. In the Si melt, C is allowed to dissolve from a high-temperature region in a lower portion of the crucible to obtain a Si—C melt. A SiC seed crystal is brought into contact with the Si—C melt and SiC is epitaxially grown on the SiC seed crystal to obtain a SiC single crystal.

In such a solution method, crystal growth of SiC proceeds in the state extremely close to thermal equilibrium. Thus, a SiC single crystal having few defects can be obtained compared to that obtained by the sublimation method.

As the solution method for obtaining a SiC single crystal, various processes are known. In "the most recent technology for a SiC power device" (in the first chapter, 1.2 Process for SiC solution growth, pages 41 to 43 (Science & Technology, published on May 14, 2010)), the processes are roughly divided into four categories: (a) Traveling Solvent Method (TSM), (b) Slow Cooling Technique (SCT), (c) Vapor Liquid Solid (VLS) Method and (d) Top Seeded Solution Growth (TSSG) Method. The term "solution method" used in the specification refers to Top Seeded Solution Growth (TSSG) Method.

In a solution method for producing a SiC single crystal, a Si melt is prepared and placed in a graphite crucible. Since the solubility of C in the Si melt is extremely low (about 1 at %), a transition metal and the like are generally added in the Si melt in order to facilitate dissolution of C (see, for example, Japanese Patent Laid-Open Nos. 2000-264790, 2004-002173 and 2006-143555).

The type and amount of such an additional element are determined in consideration of the following conditions: accelerating dissolution of C by the element; precipitating SiC as a primary crystal from the solution while the remainder is satisfactorily equilibrated as a liquid phase; precipitating none of a carbide and other phases by addition of the element; and stably precipitating a desired polymorph among the SiC crystal polymorphs, and obtaining a solution composition for increasing a single crystal growth rate as much as possible.

Conventional solution methods using a graphite crucible, however, have the following problems.

A first problem is that a solution composition gradually changes with the growth of a SiC single crystal, since a Si component runs out little by little from a Si—C solution. If the solution composition changes during growth of the SiC single crystal, the precipitation environment of SiC naturally changes. As a result, it becomes difficult to continuously grow the SiC single crystal, stably for a long time.

A second problem is a matter of an excessive dissolution of C derived from a graphite crucible. As a SiC single crystal grows, a Si component gradually runs out from the Si—C solution; whereas C is continuously supplied from the graphite crucible. Therefore, C is excessively dissolved into the Si—C solution, with the result that the Si/C component ratio in the solution changes.

A third problem is a matter of precipitation of a SiC polycrystal on the inner surface of the graphite crucible in contact with the Si—C solution. If C is excessively dissolved into the Si—C solution from the graphite crucible, as mentioned above, fine SiC polycrystals are likely to precipitate onto the inner surface of the graphite crucible. Such SiC polycrystals migrate through the SIC solution, reach near a solid-liquid interface between growing SiC single crystal and the Si—C solution, and inhibit growth of a single crystal.

The present invention was made in view of such problems of conventional methods. An object of the present invention is to provide a technique for obtaining a high-quality single crystal silicon carbide having few defects, compared to conventional methods using a graphite crucible, by suppressing not only a compositional change of a Si—C solution but also precipitation of a polycrystal on the inner wall of a crucible.

SUMMARY OF THE INVENTION

A method for growing a silicon carbide crystal according to the present invention developed to solve the aforementioned problems, is a method for growing a silicon carbide crystal by a solution method using a crucible formed of SiC as a main component, as a container for a Si—C solution, including heating the crucible to elute Si and C, which are derived from a main component SiC of the crucible, from a high-temperature surface region of the crucible in contact with the Si—C solution, into the Si—C solution; and moving down a SiC seed crystal closer to the Si—C solution from the upper portion of the crucible and bringing the seed crystal into contact with the Si—C solution to grow a SiC single crystal on the SiC seed crystal.

Preferably, the heating is carried out such that an isothermal line representing a temperature distribution within the crucible draws an inverted convex shape.

Preferably, the heating is carried out so as to form a temperature distribution where the temperature of the Si—C solution in the crucible formed of SiC as a main component increases from the top to the bottom.

Preferably, precipitation of a SiC polycrystal on a surface of the crucible in contact with the Si—C solution is suppressed by elution of the Si and C into the Si—C solution.

Preferably, metal M having an effect of improving solubility of C in the Si—C solution is added in advance to the Si—C solution.

Preferably, the temperature of the Si—C solution is controlled by the heating within the range of 1300° C. to 2300° C.

Preferably, the heating is carried out in a state where the crucible formed of SiC as a main component is contained in a second crucible formed of a heat-resistant carbon material.

According to the present invention, not only a compositional change of a Si—C solution but also precipitation of polycrystals on the inner wall of the crucible as well as generation of a metal carbide formed by binding an added metal element M and carbon C are suppressed by using a crucible formed of SiC as a main component. As a result, a high-quality single crystal silicon carbide having few defects compared to conventional methods using a graphite crucible can be obtained.

DETAILED DESCRIPTION OF THE PREFERRED EMBODIMENT

The method for growing a silicon carbide crystal by the solution method according to the present invention will be described below by way of the accompanying drawings. Note that in the embodiment of the present invention that will be described below, a SiC crucible is heated by high-frequency heating; however, the heating method is not limited to the high-frequency heating, and other methods such as resistance heating may be used depending upon the temperature of a Si—C solution to be controlled.

Figure 1:
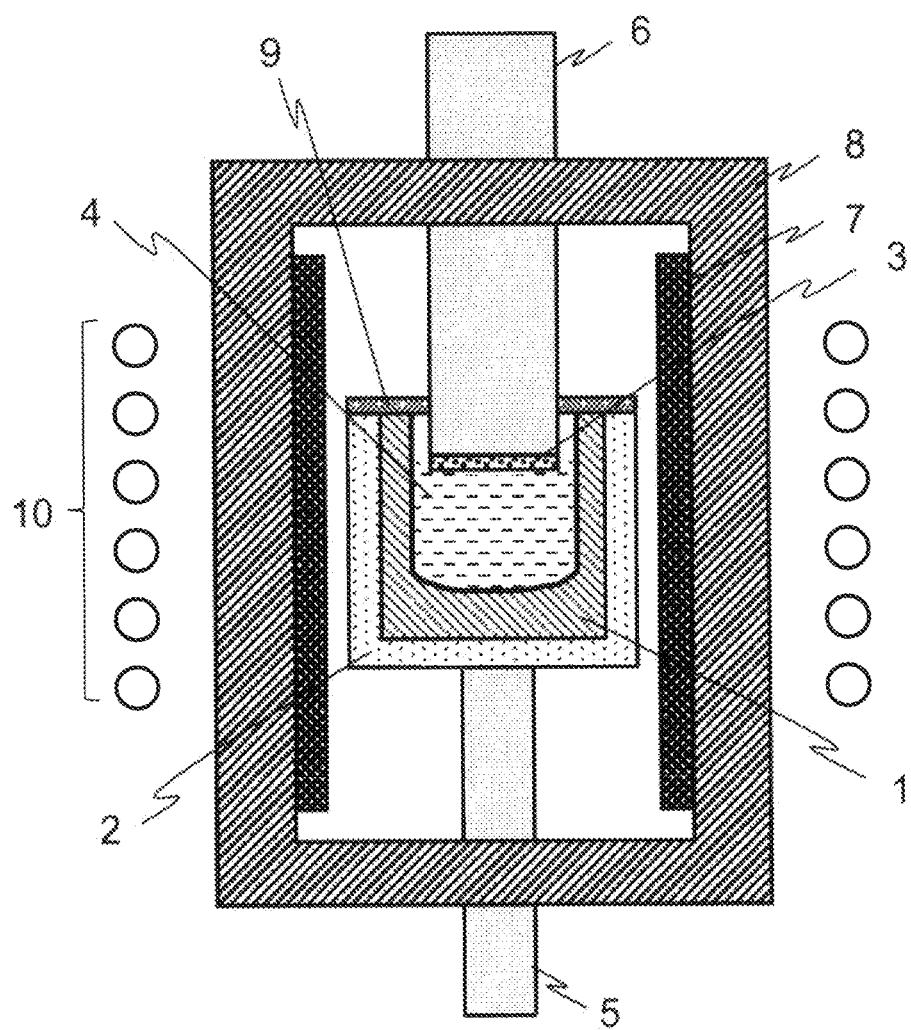
FIG. 1 is a view illustrating the structure of a main portion of an apparatus for use in growing a silicon carbide crystal in accordance with the method of the present invention.

FIG. 1 is a view illustrating the structure of a main portion of an apparatus for use in growing a silicon carbide crystal in accordance with the method of the present invention.

In the figure, reference symbol 1 represents a crucible formed of SiC as a main component and serving as a container of a Si—C solution; reference symbol 2 a second crucible formed of a heat-resistant carbon material for housing the SiC crucible 1; reference symbol 3 a SiC single crystal as a seed crystal, reference symbol 4 a Si—C solution formed in the SiC crucible 1, reference symbol 5 a crucible rotation shaft for rotating the crucible 1 (and the crucible 2) during growth of the SiC crystal, reference symbol 6 a seed-crystal rotation shaft, which holds the seed crystal 3 and rotates the seed crystal 3 during growth of the SiC crystal; reference symbol 7 a susceptor formed of e.g., a graphite material, reference symbol 8 an insulating material also formed of e.g., a graphite material, reference symbol 9 a top cover for suppressing evaporation of the Si—C solution and reference symbol 10 a high-frequency coil for heating the SiC crucible 1 and providing a preferable temperature distribution within the SiC solution 4.

Note that a discharge port and a discharge valve for evacuating the atmosphere in the furnace (not shown), and a gas introduction port and a gas introduction valve (not shown) for introducing gas are provided. Although the SiC crucible 1 before heating is charged with Si, the SiC crucible 1 may be charged with a C source as well in advance.

Figure 2:
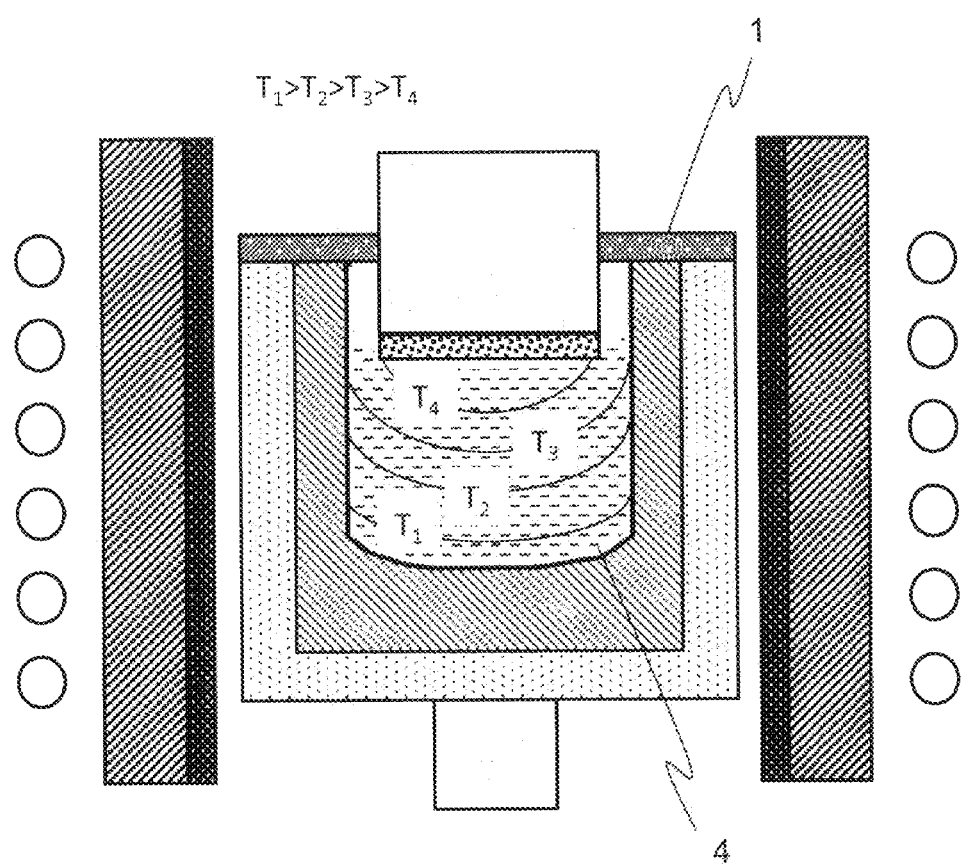
FIG. 2 is a conceptual view illustrating the temperature distribution in a Si—C solution in growing a silicon carbide crystal in accordance with the method of the present invention.

FIG. 2 is a conceptual view illustrating temperature distribution in a Si—C solution in growing a silicon carbide crystal in accordance with the method of the present invention. In the figure, which is a sectional view of the SiC crucible 1, the curves represented by $T_1$ to $T_4$ each independently represent an isothermal curve showing the same temperature portions in the Si—C solution, and satisfy the relationship of $T_1 > T_2 > T_3 > T_4$. In other words, the Si—C solution 4 in the SiC crucible 1 has a temperature distribution which increases from the top to the bottom and each temperature curve (isothermal line) draws an inverted convex shape.

In the present invention, the temperature distribution of the Si—C solution 4 as mentioned above is formed by induction heating of the SiC crucible 1 by the high-frequency coil 10. Simultaneously, from the surface of the SiC crucible 1 in contact with the Si—C solution 4, Si and C, which are derived from a main component SiC of the crucible, are eluted in the Si—C solution 4. Then, the SiC seed crystal 3 is moved down closer to the Si—C solution 4 from the upper portion of the SiC crucible 1 and brought into contact with the SiC seed crystal 3 to grow a SiC single crystal on the SiC seed crystal 3. Accordingly, at least temperature $T_1$ of $T_1$ to $T_4$ shown in FIG. 2 is specified to be sufficiently high to elute Si and C from the SiC crucible 1 into the Si—C solution 4, and temperature $T_4$ is specified to be sufficiently satisfactory for SiC to grow as a single crystal on the SiC seed crystal 3.

Figure 3:
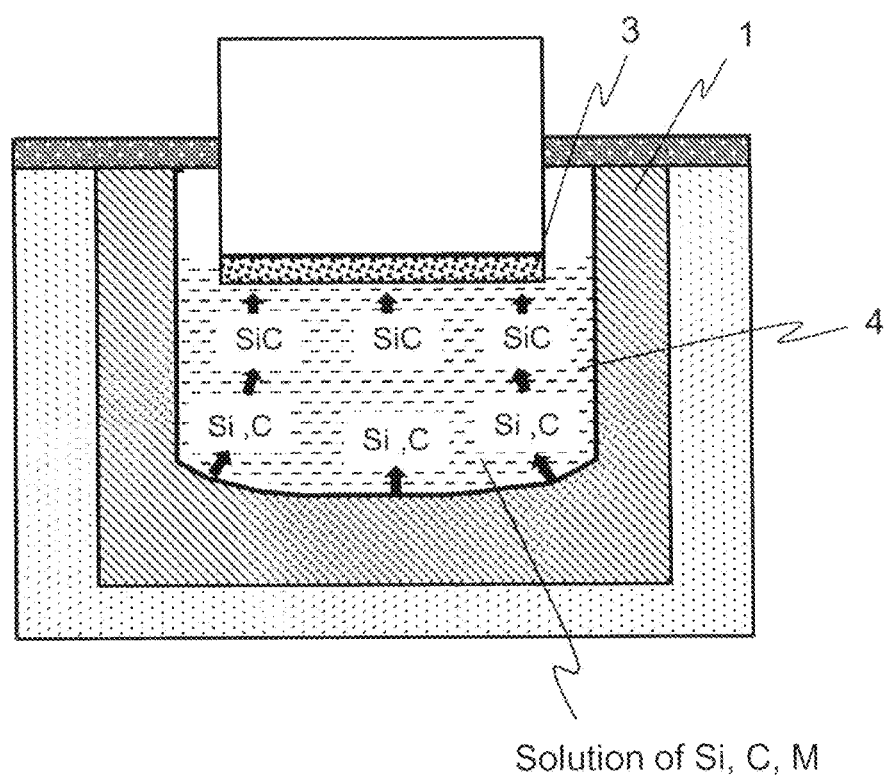
FIG. 3 is a conceptual view illustrating elution of Si and C from the wall surface of a SiC crucible into a Si—C solution in growing a silicon carbide crystal in accordance with the method of the present invention.

FIG. 3 is a conceptual view illustrating elution of Si and C from the wall surface of a SiC crucible into a Si—C solution in growing a silicon carbide crystal in accordance with the method of the present invention. Note that in the figure, reference symbol M represents a metal element having an effect of improving solubility of C in the Si—C solution 4. The metal element to be added is not limited to a single element and a plurality of types of metal elements may be added.

If the aforementioned temperature distribution is formed, from the surface (high temperature region) of the SiC crucible 1 in contact with the Si—C solution 4, Si and C, which are derived from a main component SiC of the crucible 1, are eluted. The Si and C eluted naturally serve as a new Si component and C component of the Si—C solution 4, and are used as a source of a single crystal to be grown on the SiC seed crystal 3.

In such an environment where Si and C are eluted from the SiC crucible 1 into the Si—C solution 4, a problem of SiC polycrystal precipitation would not occur on the surface of the crucible in contact with the Si—C solution. This is because under the condition where Si and C are eluted from SiC (a main component of the crucible 1) into the Si—C solution 4, it is impossible for Si and C to precipitate as SiC. In other words, owing to use of a crucible containing SiC as a main component as a container of the Si—C solution, precipitation of a SiC polycrystal is suppressed on the surface of the crucible in contact with the Si—C solution.

In addition, use of the SiC crucible is also advantageous since formation of a metal carbide, which is formed by binding an added metal element M and carbon C, is suppressed. When a graphite crucible is used, the proportion of the Si component in the Si—C solution reduces or the Si/C component ratio reduces due to excessive dissolution of C. If so, a metal element M, which is added to facilitate dissolution of carbon C, comes to easily bind to carbon C to likely form a metal carbide. Since the melting point of such a metal carbide is high, the metal carbide migrates in the Si—C solution, reaches near the surface of a seed crystal and serves as a cause of inhibiting formation of a SiC single crystal. In contrast, when a SiC crucible is used, carbon C is not excessively dissolved into a Si—C solution, with the result that the aforementioned formation of a metal carbide is suppressed and formation of a desired single SiC crystal can be facilitated.

As described above, in the method for growing a silicon carbide crystal according to the present invention, which uses a crucible formed of SiC as a main component, as a container for a Si—C solution, a SiC single crystal is grown on a SiC seed crystal by heating the crucible to elute Si and C, which are derived from a main component SiC of the crucible, from a high temperature surface region of the crucible in contact with the Si—C solution, into the Si—C solution, and moving down the SiC seed crystal closer to the Si—C solution from the upper portion of the crucible and bringing the seed crystal into contact with the Si—C solution. The temperature of the Si—C solution during crystal growth is generally controlled within the range of 1300° C. to 2300° C.

Note that, the compositional change of the Si—C solution 4 can be suppressed by controlling the supply amounts of Si and C from the crucible 1 so as to correspond to the consumed amounts of the Si and C in the Si—C solution 4 with the growth of the SiC single crystal, not only by appropriately controlling the temperature distribution by proper control of induction heating from the high-frequency coil 10 during a process for growing a SiC single crystal, but also by appropriately controlling the growth rate of a single SiC crystal and the elution rates of Si and C into the SiC solution 4, for example, by moving the position of the crucible 1 up and down and rotating the crucible 1 and the seed crystal 3.

Figure 4:
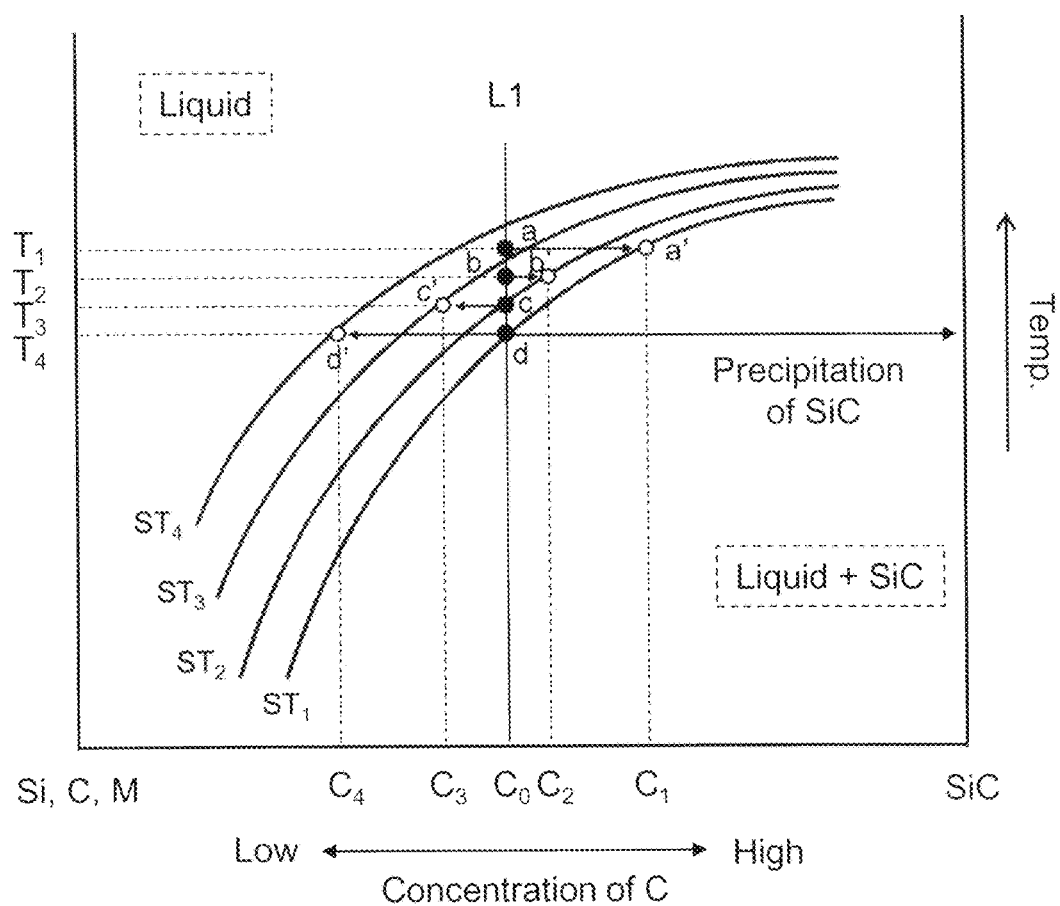
FIG. 4 is a conceptual diagram illustrating the mechanisms of an elution reaction of Si and C from a SiC crucible and a precipitation reaction of SiC on a SiC seed crystal in the method for growing a silicon carbide crystal of the present invention using a SiC crucible.

FIG. 4 is a conceptual diagram illustrating the mechanisms of an elution reaction of Si and C from a SiC crucible and a precipitation reaction of SiC on a SiC seed crystal in the method for growing a silicon carbide crystal of the present invention using a SiC crucible. This diagram shows the state of a pseudobinary system of a sectional solid-liquid interface between SiC and Si—C solution (solution containing Si, C and M). The vertical axis represents temperature; whereas the horizontal axis represents the concentration of C in the solution. A concentration of C increases as the position on the horizontal axis becomes closer to the most right position. The right end represents a SiC crystal.

In the figure, curves $ST_1$ to $ST_4$ represent the boundaries between a liquid phase (Liquid) and a solid-liquid coexisting phase (Liquid+SiC) at temperatures $T_1$ to $T_4$ shown in FIG. 2, respectively, and also called as solubility curves. These solubility curves each mean that the Si—C solution can dissolve C up to the curve line. The upper left side portion of each of the solubility curves represents a liquid phase, which consists of Si, C and M and homogeneously dissolves Si and C. In contrast, the lower right side portion of each of the solubility curves represents the state where two phases, a SiC solid phase and a solution phase dissolving Si, C and M, are present together.

As shown in FIG. 4, since the solubility of C increases as the temperature of the solution increases, solubility curve $ST_1$ of a relatively high temperature of $T_1$ is positioned on the right side in the figure compared to the other solubility curves. In contrast, since the solubility of C decreases as the temperature of the solution decreases, solubility curve $ST_4$ of a relatively low temperature of $T_4$ is positioned on the left side compared to the other solubility curves.

Herein, solution L1 having a C concentration of $C_0$ is taken as an example. Assuming that if solution L1 has the temperature distribution ($T_1>T_2>T_3>T_4$) as shown in FIG. 2, the solubilities of solution L1 at respective temperatures are represented by points a to d shown in FIG. 4. As is apparent from FIG. 4, since point a is located at the left side of the point on the solubility curve $ST_1$ at temperature $T_1$, the solution can further dissolve SiC. Consequently, the component ratio of solution L1 shifts toward a'. In short, Si and C are further dissolved in the solution exhibiting a solubility of a, from SiC of a crucible.

At point b exhibiting the solubility at temperature $T_2$, which is lower temperature than $T_1$, SiC can be dissolved but slightly, as is the same as in point a. Consequently, the component ratio of solution L1 shifts toward b'.

At temperature $T_3$ (solubility: c), which is further lower temperature, point c is located below the solubility curve $ST_3$ at temperature $T_3$. Thus, the solution cannot dissolve SiC and conversely allows SiC to precipitate. However, to actually cause precipitation, a supercooling state must be present to some extent. Unfortunately, it is not unconditionally determined whether the state of the point exhibiting a solubility of c (located right under the solubility curve $ST_3$) is placed in a sufficient supercooling state. Herein, we presume that precipitation of SiC has not occurred since the point exhibiting solubility of c may not be placed in the supercooling state.

At point d at temperature $T_4$, which is lower temperature than $T_3$, a sufficiently supercoiling state is realized. SiC precipitates in the vicinity of temperature $T_4$. Since the seed crystal is present at such a temperature, a SiC single crystal can grow on the SiC seed crystal. Owing to this precipitation reaction, SiC precipitates from solution L1 and the component ratio of liquid phase L1 shifts toward d'.

Si and C are continuously eluted from a crucible; however, a single crystal is usually grown while rotating the crucible and a seed crystal and thus the composition of the Si—C solution is homogenized by stirring. As a result, the state of the solution shown in FIG. 3 can be realized.

According to the present invention, a high-quality SiC single crystal can be produced stably for a long time by a solution method. The reasons thereof will be summarized as follows.

In conventional solution methods using a crucible formed of a heat-resistant carbon material represented by a graphite crucible, a solution is contained in the crucible and C is allowed to elute from the crucible to supply C to the solution. However, as a crystal growth of SiC proceeds, the Si component ratio in the solution inevitably reduces.

In contrast, in the present invention, a crucible containing SiC as a main component is used as a container and Si and C are supplied to a solution from a crucible component, SiC (used as a source). In this case, even if a crystal growth of SiC proceeds on a seed crystal, the consumed amounts of Si and C in the solution are made up for from the SiC crucible. As a result, a compositional change of the solution is suppressed and a SiC single crystal can be stably grown for a long time.

Such a crystal growth method of the present invention is said to be analogous to the FZ method or a kind of the FZ method. In the FZ method, melting of a polycrystal portion and growth of a single crystal portion proceed through a Si melt portion. Also in the crystal growth method of the present invention, a crucible corresponding to the above polycrystal portion is heated to melt and a SiC single crystal is grown on a seed crystal through a solution containing Si and C, corresponding to the above melt portion.

EXAMPLES

Now, the crystal growth method of the present invention will be more specifically described below by way of Examples.

Example 1

A SiC single crystal was grown by use of the apparatus having the structure shown in FIG. 1. The SiC crucible 1 charged with a Si polycrystal (purity 99 wt %) serving as a raw material and Cr (purity 99 wt %) serving as a metal having an effect of increasing a solubility of C to a Si—C solution was placed in the second crucible 2 formed of a heat-resistant carbon material. Induction heating was applied by high-frequency coil 10 under vacuum or an Ar atmosphere to dissolve the raw materials charged in the SiC crucible 1 for three hours.

The SiC crucible 1 used herein has an outer diameter of 70 mm, an inner diameter of 50 mm, an out-wall height of 80 mm and an inner wall height of 70 mm. Furthermore, as the seed crystal 3, a 4H type SiC single crystal having a diameter of 21 mm and a thickness of 0.4 mm was used. The seed crystal 3 was attached to an end surface of a seed crystal rotation axis 6 (19 mm in diameter) formed of graphite such that a crystal is grown on the C surface.

The Si polycrystal and Cr to be charged in the SiC crucible 1 were prepared so as to satisfy a bath organization in a dissolved state: Cr: 38 at % and Si: 62 at %. Note that these raw materials contain Fe as an impurity in an amount of 1 wt % or less.

When the surface temperature of the solution in the SiC crucible 1 was measured by a pyroscope from the above portion of the apparatus, it was 1800° C. The SiC crucible 1 was maintained in this state for two hours to allow Si and C to elute from the SiC crucible 1 into the solution to obtain a Si—C (—Cr) solution. The SiC seed crystal 3 was moved down closer to the Si—C solution from the above portion of the crucible 1 and brought into contact with the Si—C solution to grow a SiC single crystal on the SiC seed crystal 3.

During the crystal growth, the pulling rate of the seed crystal rotation axis 6 was set at 0.5 mm/h and the rotation rate at 20 rpm. Furthermore, the SiC crucible 1 was rotated at 20 rpm. After single crystal growth was performed for 10 hours, Ar gas was introduced into the furnace to cool the furnace to room temperature.

Figure 5:
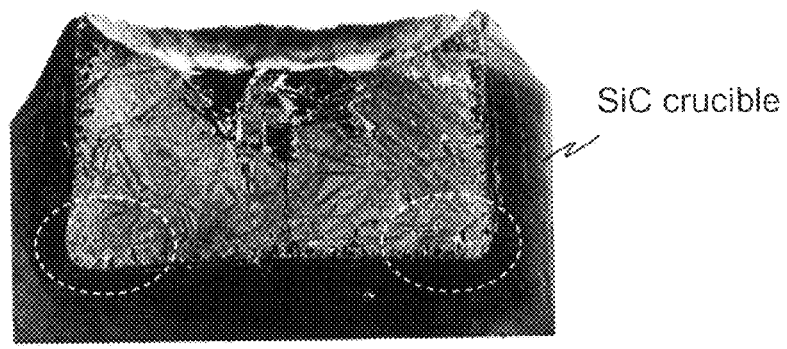
FIG. 5 is an optical micrograph of a section of a SiC crucible 1 obtained by taking out the crucible after crystal growth in Example 1 and cutting it.

FIG. 5 is an optical micrograph of a section of the SiC crucible 1 taken out after crystal growth. At both sides of the bottom portion of the SiC crucible 1, erosion due to elution of Si and C into a Si—C solution is clearly observed.

Figure 6:
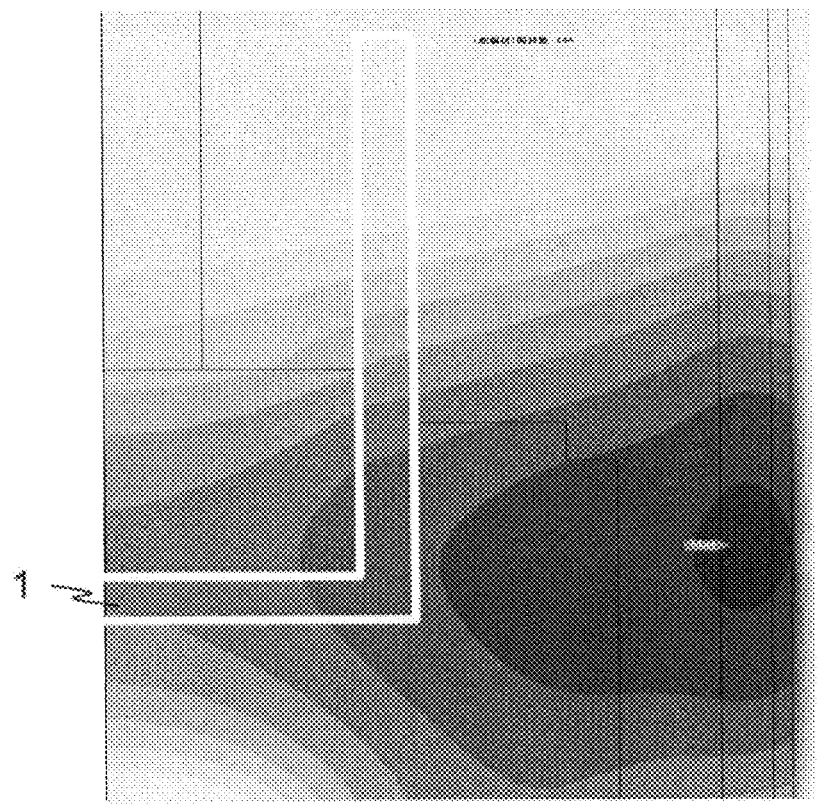
FIG. 6 shows the simulation results of temperature distribution within a furnace based on single crystal growth conditions in Example 1 as parameters.

FIG. 6 shows the simulation results of temperature distribution within the furnace based on the single crystal growth conditions as parameters. In the figure, the contour of the SiC crucible 1 on the right half is indicated by a white line. From the simulation, it is found that the eroded portions at both sides of the bottom portion of the SiC crucible 1, which are apparently seen in FIG. 5, have the highest temperature. The simulation was run under the conditions of Example 6 (described later). According to the simulation results, the temperatures shown in FIG. 2 are as follows: $T_1$=1934° C., $T_2$=1926° C., $T_3$=1918° C., $T_4$=1918° C.

Figure 7:
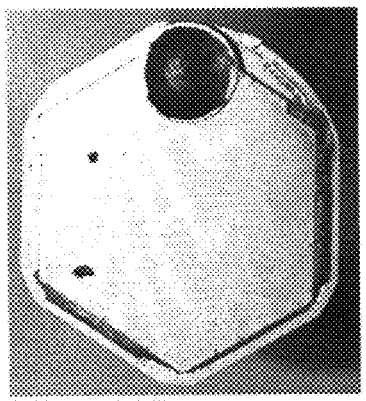
FIG. 7 shows an optical micrograph (A) of a top surface of the SiC single crystal obtained under the conditions of Example 1 and an optical micrograph (B) of the side surface thereof.
Figure 7:
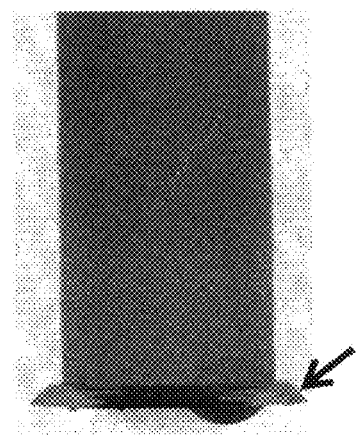

FIG. 7 shows an optical micrograph (A) of a top surface of the SiC single crystal obtained under the above conditions and an optical micrograph (B) of the side surface thereof. A SiC single crystal is indicated by the arrow in FIG. 7(B). No defects were visually observed and the surface is confirmed to be smooth.

Figure 8:
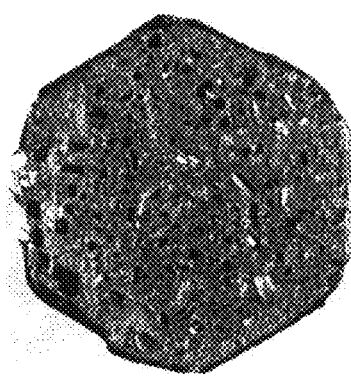
FIG. 8 shows an optical micrograph (A) of a top surface of the SiC crystal of Comparative Example 1, which was grown under the same condition as in Example 1 except that a graphite crucible was used in place of a SiC crucible, and an optical micrograph (B) of the side surface thereof.
Figure 8:
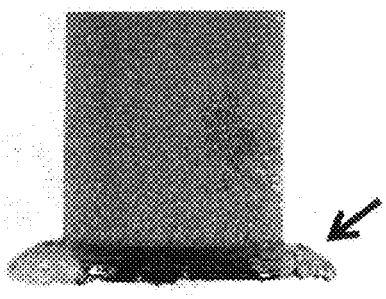

FIG. 8 shows an optical micrograph (A) of a top surface of the SiC crystal of Comparative Example 1, which was grown under the same condition as in Example 1 except that a graphite crucible was used in place of the SiC crucible 1 and an optical micrograph (B) of the side surface thereof. Many crystal grain boundaries are observed on the crystal surface and single crystals are not obtained.

Example 2

A SiC single crystal was grown in the same conditions as in Example 1 except that the initial composition of the solution was prepared so as to contain 20 at % of Ti and 80 at % of Si. Note that these raw materials contain Fe as an impurity in an amount of 1 wt % or less.

Figure 9:
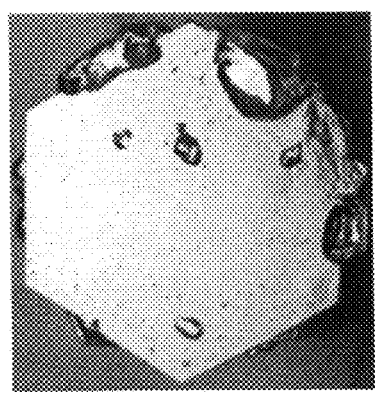
FIG. 9 shows an optical micrograph (A) of a top surface of the SiC single crystal obtained in Example 2 and an optical micrograph (B) of the top surface of the SiC crystal obtained in Comparative Example 2.
Figure 9:
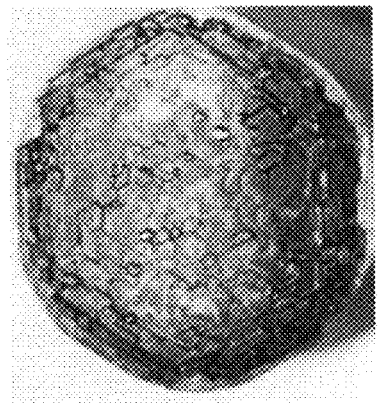

FIG. 9(A) shows an optical micrograph of a top surface of the SiC single crystal obtained in the above conditions. No defects are visually observed and the surface is confirmed to be smooth.

FIG. 9(B) shows an optical micrograph of a top surface of the SiC crystal of Comparative Example 2, which was grown under the same condition in Example 2 except that a graphite crucible was used in place of the SiC crucible 1. Many crystal grain boundaries were observed in the crystal surface and single crystals are not obtained.

Example 3

A SiC single crystal was grown in the same conditions as in Example 1 except that the initial composition of the solution was prepared so as to contain 20 at % of Al and 80 at % of Si. Note that these raw materials contain Fe as an impurity in an amount of 1 wt % or less.

Figure 10:
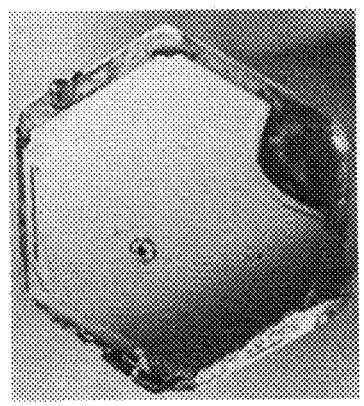
FIG. 10 shows an optical micrograph (A) of a top surface of the SiC single crystal obtained in Example 3 and an optical micrograph (B) of the top surface of the SiC crystal obtained in Comparative Example 3.
Figure 10:
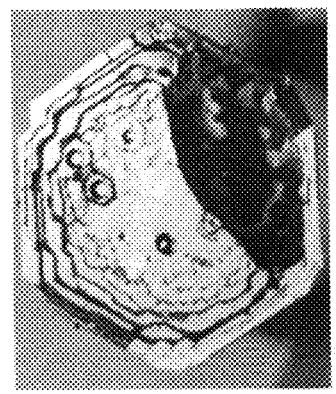

FIG. 10(A) shows an optical micrograph of a top surface of the SiC single crystal obtained in the above conditions. No defects are visually observed and the surface is confirmed to be smooth.

FIG. 10(B) shows an optical micrograph of a top surface of the SiC crystal of Comparative Example 3, which was grown in the same conditions as in Example 3 except that a graphite crucible was used in place of the SiC crucible 1. Many crystal grain boundaries are observed in the crystal surface and single crystals are not obtained.

Example 4

A SiC single crystal was grown in the same conditions as in Example 1 except that the initial composition of the solution was prepared so as to contain 20 at % of Pr and 80 at % of Si. Note that these raw materials contain Fe as an impurity in an amount of 1 wt % or less.

Figure 11:
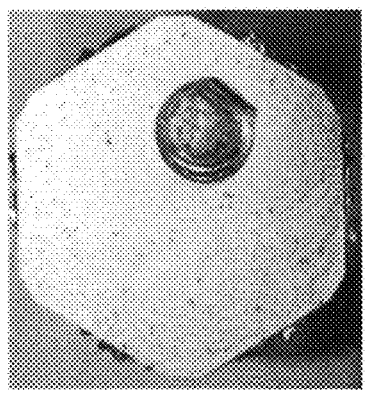
FIG. 11 shows an optical micrograph (A) of a top surface of the SiC single crystal obtained in Example 4 and an optical micrograph (B) of the top surface of the SiC crystal obtained in Comparative Example 4.
Figure 11:
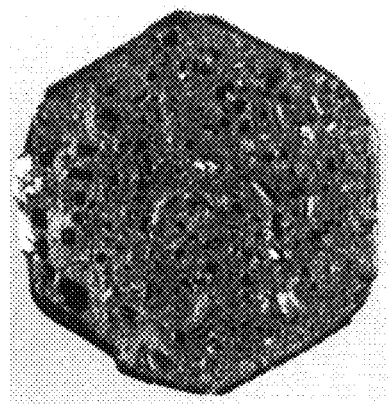

FIG. 11(A) shows an optical micrograph of a top surface of the SiC single crystal obtained in the above conditions. No defects are visually observed and the surface is confirmed to be smooth.

FIG. 11(B) shows an optical micrograph of a top surface of the SiC crystal of Comparative Example 4, which was grown in the same conditions as in Example 4 except that a graphite crucible was used in place of the SiC crucible 1. Many crystal grain boundaries were observed in the crystal surface and single crystals are not obtained.

Example 5

A SiC single crystal was grown in the same conditions as in Example 1 except that the initial composition of the solution was prepared so as to contain 20 at % of Pr, 30 at % of Cr and 50 at % of Si. Note that these raw materials contain Fe as an impurity in an amount of 1 wt % or less.

Figure 12:
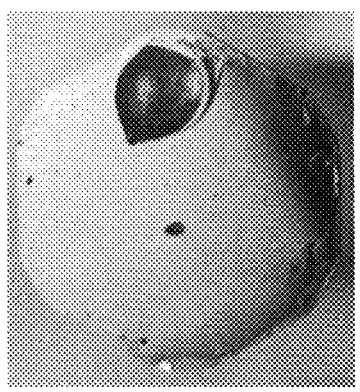
FIG. 12 shows an optical micrograph (A) of a top surface of the SiC single crystal obtained in Example 5 and an optical micrograph (B) of the top surface of the SiC crystal obtained in Comparative Example 5.
Figure 12:
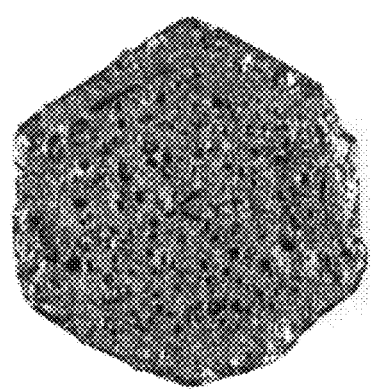

FIG. 12(A) shows an optical micrograph of a top surface of the SiC single crystal obtained in the above conditions. No defects are visually observed and the surface is confirmed to be smooth.

FIG. 12(B) shows an optical micrograph of a top surface of the SiC crystal of Comparative Example 5, which was grown in the same conditions as in Example 5 except that a graphite crucible was used in place of the SiC crucible 1. Many crystal grain boundaries were observed in the crystal surface and single crystals are not obtained.

Example 6

A SiC single crystal was grown in the same conditions as in Example 1 except that the initial composition of the solution was prepared so as to contain 20 at % of Pr, 30 at % of Fe and 50 at % of Si. Note that these raw materials contain Cr as an impurity in an amount of 1 wt % or less.

Figure 13:
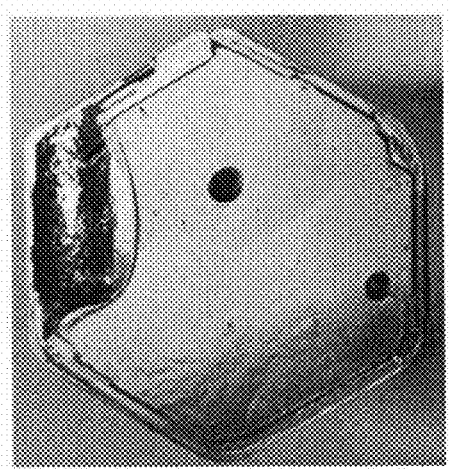
FIG. 13 shows an optical micrograph of a top surface of the SiC single crystal obtained in Example 6.

FIG. 13 shows an optical micrograph of a top surface of the SiC single crystal obtained in the above conditions. No defects are visually observed and the surface is confirmed to be smooth.

In the above Examples, Cr, Ti, Al and Pr are each selected as the metal element to be added to a Si—C solution; however, various metal elements can be selected other than these.

For example, a metal element may be at least one selected from the group consisting of La, Ce, Pr, Nd, Sm, Eu, Gd, Tb, Dy, Ho and Lu.

For example, a metal element may be at least one selected from the group consisting of Ti, V, Cr, Mn, Fe, Co, Ni and Cu.

For example, a metal element may be at least one selected from the group consisting of Al, Ga, Ge, Sn, Pb and Zn.

Note that the above metal elements may be used in combination, for example, a combination of at least one metal element M1 selected from the group consisting of La, Ce, Pr, Nd, Sm, Eu, Gd, Tb, Dy, Ho and Lu and at least one metal element M2 selected from the group consisting of Ti, V, Cr, Mn, Fe, Co, Ni and Cu.

Usually, such a metal element is added so as to satisfy the total content of 1 at % to 80 at % in a Si—C solution.

As described above, according to the method for growing a silicon carbide crystal of the present invention, a compositional change of a Si—C solution is low and generation of a polycrystal precipitating on the inner wall of a crucible is suppressed, compared to conventional methods using a graphite crucible. As a result, high-quality single crystal silicon carbide having few defects can be obtained.

The method for growing a silicon carbide crystal according to the present invention is summarized as follows.

A method for growing a silicon carbide crystal by a solution method using a crucible formed of SiC as a main component, as a container for a Si—C solution, including heating the crucible to elute Si and C, which are derived from a main component SiC of the crucible, from a high-temperature surface region of the crucible in contact with the Si—C solution, into the Si—C solution; and moving down a SiC seed crystal closer to the Si—C solution from the upper portion of the crucible and bringing the seed crystal into contact with the Si—C solution to grow a SiC single crystal on the SiC seed crystal.

Preferably, the heating is carried out such that an isothermal line representing a temperature distribution within the crucible draws an inverted convex shape.

Preferably, the heating is carried out so as to form a temperature distribution where temperature of the Si—C solution in the crucible formed of SiC as a main component increases from the top to the bottom.

Preferably, precipitation of a SiC polycrystal on a surface of the crucible in contact with the Si—C solution is suppressed by elution of the Si and C into the Si—C solution.

Preferably, metal M having an effect of improving solubility of C in the Si—C solution is added in advance to the Si—C solution.

Preferably, the temperature of the Si—C solution is controlled by the heating within the range of 1300° C. to 2300° C.

Preferably, the heating is carried out in a state where the crucible formed of SiC as a main component is contained in a second crucible formed of a heat-resistant carbon material.

According to the method for growing a silicon carbide crystal of the present invention, not only a compositional change of a Si—C solution is suppressed but also precipitation of polycrystals on the inner wall of the crucible as well as generation of a metal carbide formed by binding an added metal element M and carbon C are suppressed, compared to conventional methods using a graphite crucible. As a result, a high-quality single crystal silicon carbide having few defects can be obtained.

What is claimed is:

1. A method for growing a silicon carbide crystal by a solution method using a crucible formed of SiC as a main component, as a container for a Si—C solution, comprising
    heating the crucible to elute Si and C, which are derived from a main component SiC of the crucible, from a high-temperature surface region of the crucible in contact with the Si—C solution, into the Si—C solution so that precipitation of a SiC polycrystal on a surface of the crucible in contact with the Si—C solution is suppressed by elution of the Si and C into the Si—C solution; and
    moving down a SiC seed crystal closer to the Si—C solution from an upper portion of the crucible and bringing the seed crystal into contact with the Si—C solution to grow a SiC single crystal on the SiC seed crystal, and wherein
    the heating is carried out to form a temperature distribution where the temperature of the Si—C solution in the crucible increases from the top to the bottom, and at the bottom portion of the crucible has the highest temperature.

2. The method for growing a silicon carbide crystal according to claim 1, wherein metal M having an effect of improving solubility of C in the Si—C solution is added in advance to the Si—C solution.

3. The method for growing a silicon carbide crystal according to claim 1, wherein the temperature of the Si—C solution is controlled by the heating within the range of 1300° C. to 2300° C.

4. The method for growing a silicon carbide crystal according to claim 1, wherein the heating is carried out in a state where the crucible formed of SiC as a main component is contained in a second crucible formed of a heat-resistant carbon material.

5. The method for growing a silicon carbide crystal according to claim 1, wherein the heating is carried out such that an isothermal line representing a temperature distribution within the crucible draws an inverted convex shape.

6. The method for growing a silicon carbide crystal according to claim 5, wherein metal M having an effect of improving solubility of C in the Si—C solution is added in advance to the Si—C solution.

7. The method for growing a silicon carbide crystal according to claim 5, wherein the temperature of the Si—C solution is controlled by the heating within the range of 1300° C. to 2300° C.

8. The method for growing a silicon carbide crystal according to claim 5, wherein the heating is carried out in a state where the crucible formed of SiC as a main component is contained in a second crucible formed of a heat-resistant carbon material.

* * * * *